(12) United States Patent
Sun

(10) Patent No.: US 10,147,902 B2
(45) Date of Patent: Dec. 4, 2018

(54) COVER PLATE, AND CURVED DISPLAY APPARATUS

(71) Applicant: BOE TECHNOLOGY GROUP CO., LTD, Beijing (CN)

(72) Inventor: Li Sun, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 8 days.

(21) Appl. No.: 15/031,231

(22) PCT Filed: Sep. 18, 2015

(86) PCT No.: PCT/CN2015/089978
§ 371 (c)(1),
(2) Date: Apr. 21, 2016

(87) PCT Pub. No.: WO2016/123984
PCT Pub. Date: Aug. 11, 2016

(65) Prior Publication Data
US 2016/0359132 A1  Dec. 8, 2016

(30) Foreign Application Priority Data

Feb. 5, 2015  (CN) .......................... 2015 1 0062363

(51) Int. Cl.
*H01L 51/52* (2006.01)
*H01L 51/00* (2006.01)

(52) U.S. Cl.
CPC ........ *H01L 51/524* (2013.01); *H01L 51/0097* (2013.01); *H01L 51/5243* (2013.01); *H01L 2251/5338* (2013.01); *Y02E 10/549* (2013.01)

(58) Field of Classification Search
CPC ..................................................... H01L 51/525
See application file for complete search history.

(56) References Cited

U.S. PATENT DOCUMENTS

| | | |
|---|---|---|
| 8,294,869 B2 | 10/2012 | Yamaguchi et al. |
| 2005/0285134 A1 | 12/2005 | Kang et al. |
| 2006/0273304 A1 | 12/2006 | Cok |
| 2010/0073620 A1 | 3/2010 | Yamaguchi et al. |
| 2012/0262660 A1 | 10/2012 | Fujiwara et al. |
| 2013/0161684 A1 | 6/2013 | Momma et al. |

(Continued)

FOREIGN PATENT DOCUMENTS

| | | |
|---|---|---|
| CN | 202153541 U | 2/2012 |
| CN | 103985825 A | 8/2014 |

(Continued)

OTHER PUBLICATIONS

The State Intellectual Property Office of the People's Republic of China (SIPO) OFfice Action 2 for 201510062363.2 dated Nov. 15, 2016 pp. 1-14.

(Continued)

*Primary Examiner* — Fernando L Toledo
*Assistant Examiner* — Valerie N Newton
(74) *Attorney, Agent, or Firm* — Anova Law Group, PLLC

(57) ABSTRACT

A cover plate for packaging a curved display apparatus is provided. The cover plate includes a plate body having a plurality of grooves configured to assist to bend the plate body to cause the cover plate have a bending tendency for reducing a radial stress and tangential stress of the curved display apparatus.

20 Claims, 7 Drawing Sheets

(56) References Cited

U.S. PATENT DOCUMENTS

2014/0077340 A1    3/2014  Wang et al.
2015/0256658 A1*   9/2015  Shin .................... G06F 1/1637
                                                        455/566

FOREIGN PATENT DOCUMENTS

| CN | 104183620 A | 12/2014 |
| CN | 104600208 A | 5/2015 |
| DE | 19958516 C1 | 1/2001 |
| EP | 2827396 A2 | 1/2015 |
| WO | 2011149690 A | 12/2011 |

OTHER PUBLICATIONS

The World Intellectual Property Organization (WIPO) International Search Report for PCT/CN2015/089978 dated Dec. 16, 2015 p. 1-5.
The State Intellectual Property Office of the People's Republic of China (SIPO) Office Action 1 for 201510062363.2 dated Jun. 29, 2016 p. 1-9.
The European Patent Office (EPO) The Extended European Search Report for 15849827.9 dated Aug. 20, 2018 8 Pages.

* cited by examiner

COVER PLATE, AND CURVED DISPLAY APPARATUS

CROSS-REFERENCES TO RELATED APPLICATIONS

This application is a national phase entry under 35 U.S.C. § 371 of International Application No. PCT/CN2015/089978, filed on Sep. 18, 2015, which claims priority to Chinese Patent Application No. 201510062363.2, filed on Feb. 5, 2015. The above enumerated patent applications are incorporated by reference herein in their entirety.

FIELD OF THE INVENTION

The present invention generally relates to the field of the display technologies and, more particularly, to a cover plate, and a curved display apparatus.

BACKGROUND

Organic Light-Emitting Diode (OLED) apparatus have many advantages, including ultra-thin, low cost, low-power consumption, wide viewing-angle, all solid-state, self-emitting, low driving voltage, and flexible display, etc. Thus, the OLED apparatuss are a new generation display apparatus technology. Currently, curved-OLED display products are becoming more popular.

In an OLED apparatus, in order to prevent the organic tandem structure (the OLED light-emitting unit) from being eroded by water and oxygen, the OLED apparatus needs to be packaged. Usually, the organic tandem structure and the metal electrodes are formed on a substrate firstly; and then the organic tandem structure and the metal electrodes are packaged. That is, a packaging structure is formed on the substrate having the organic tandem structure and the metal electrodes; and the packaging structure and the substrate form a sealed structure. Thus, the organic tandem structure and the metal electrodes are protected.

Currently, a commonly used packaging method including coating an organic gel film having the ability to isolate water and oxygen on the organic tandem structure of the OLED apparatus; and followed by forming a hard protective layer, such as glass metal foil, thick poly film, etc. Thus, a packaging structure is formed.

Another commonly used method includes forming a bank or dam around the organic tandem structure of the OLED apparatus after forming the organic tandem structure on a rigid substrate; filling the bank or dam with a liquid filler having the ability to isolate water and oxygen, such as organic monomer, etc.; coating a hard protective layer, such as glass metal foil, thick poly film, etc., over the rigid substrate; and curing the liquid filler by aging, UV-light, or heating, etc. Thus, a packaging structure is formed. The hard layer includes glass, metal foil, or thick polymer film, etc.

FIG. 1 illustrates an existing OLED display panel. As shown in FIG. 1, in a manufacturing process of a curved OLED display panel, such as a large-size curved OLED display panel, a common method is to apply an external force on the substrate 1 and the packaging structure 3 to cause the substrate 1, the organic tandem structure 4 and the packaging structure 3 to bend. For example, the substrate 1 and the packaging structure 3 are pressed into a mold set.

Further, in the existing planar OLED display panel, the substrate 1 is usually made of glass. Thus, the substrate 1 has certain bendability. For the packaging structure 3, a smaller thickness may require smaller external force. When the OLED display panel is being bent, the required strength of the mold set may be smaller if the substrate 1 is made of glass and the packaging structure 3 has a smaller thickness; and it may not require extra thickness to hold the structure of the mold set. Thus, it is not only able to reduce the manufacturing difficulties and the production cost, but also keep the ultra-thin characteristic of the OLED display panel.

However, according to the present disclosure, if the packaging structure 3 is substantially thin, the strength of the packaging structure 3 may be significantly reduced. Further, the path of water and oxygen penetrating into the OLED display panel may be reduced. Thus, the life span of the OLED display panel may be adversely affected. Therefore, how to cause the packaging structure 3 to have a desired bendability and also provide a desired packaging performance to the organic tandem structure 4 has become an urgent task in the field of display technologies.

The disclosed apparatus structures, methods and systems are directed to at least partially solve one or more problems set forth above and other problems.

BRIEF SUMMARY OF THE DISCLOSURE

One aspect of the present disclosure includes providing a cover plate. The cover plate comprises a plate body having a plurality of grooves configured to assist to bend the plate body to cause the cover plate have a bending tendency for reducing a radial stress and tangential stress of the curved display apparatus.

Optionally, an open direction of the grooves is identical to a bending direction of the cover plate.

Optionally, the cover plate having the bending tendency comprises an arc surface; the arc surface of the cover plate is a portion of a cylindrical surface; a longitudinal direction of the grooves is parallel to an axis of the cylindrical surface; a cross-sectional view of the cover plate perpendicular to the axis of the cylindrical surface is an arc.

Optionally, a length of the grooves is not less than a length of the edges of the cover plate parallel to the longitudinal direction of the grooves.

Optionally, ends of the grooves level with the edges of the cover plate perpendicular to the longitudinal direction of the grooves.

Optionally, the plurality of grooves are distributed on the cover plate as an array having a plurality of rows and a plurality of columns along an extension direction of the arc; and lengths of the grooves are identical.

Optionally, the plurality of grooves are distributed on the cover plate as a single column along the extension direction of the arc; and lengths of the groove are identical.

Optionally, the plurality of grooves are randomly distributed on the cover plate along the extension direction of the arc; and the lengths of the grooves are different.

Optionally, adjacent rows of the grooves have an overlap.

Optionally, the cover plate and the grooves are both made of one of metal foil, polymer and glass.

Optionally, a cross-sectional view of one of the grooves is one of a semi-circle, semi-eclipse, triangle, and rectangle.

Optionally, a width of the grooves is approximately 3 times~1000 times of a thickness of the cover plate; and a depth of the grooves is approximately 3 times~1000 times of the thickness of the cover plate.

Another aspect of the present disclosure includes providing a curved display apparatus. The curved display apparatus comprises a packaging structure for packaging the curved display apparatus, wherein the packaging structure comprises a cover plate having a plurality of grooves to cause the cover plate to have a bending tendency for reducing a radial and tangential stress of the curved display apparatus.

Optionally, an open direction of the grooves is identical to a bending direction of the cover plate.

Optionally, the cover plate having the bending tendency comprises an arc surface; the arc surface of the cover plate is a portion of a cylindrical surface; a longitudinal direction of the grooves is parallel to an axis of the cylindrical surface; and a cross-sectional view of the cover plate perpendicular to the axis of the cylindrical surface is an arc.

Optionally, a length of the groove is no less than a length of edges of the cover plate parallel to the longitudinal direction of the grooves.

Optionally, ends of the grooves are configured to intersect the edges of the cover plate perpendicular to the longitudinal direction of the grooves.

Optionally, the plurality of grooves are distributed on the cover plate as an array having a plurality of rows and a plurality of columns along an extension direction of the arc; and lengths of the grooves are identical.

Optionally, the plurality of grooves are distributed on the cover plate as a single column along the extension direction of the arc; and lengths of the grooves are identical.

Optionally, the plurality of grooves are randomly distributed on the cover plate along the extension direction of the arc; and lengths of the grooves are different.

Optionally, the adjacent rows of the grooves have an overlap.

Optionally, a cross-sectional view of the grooves perpendicular to the axis of the cylindrical surface is one of a semi-circle, semi-eclipse triangle, and a rectangle.

Optionally, a width of the grooves is approximately 3 times~1000 times of a thickness of the cover plate; and a depth of the grooves is approximately 3 times~1000 times of the thickness of the cover plate.

Optionally, the grooves are configured to fill with one of a polymer material, an inert gas and a vacuum.

According to the disclosed embodiment, the disposing of the auxiliary bending structures on the cover plate may be able to cause the cover plate to have a bending tendency. Thus, the resilience force of the cover plate under a curved condition may be reduced. Therefore, the cover plate may be able to package a curved display apparatus; and cause the curved display apparatus to show a certain degree of curving. Further, by using such a cover plate, the cover plate may have a desired packaging effect for the curved display apparatus; and the force applied on the curved display apparatus by the cover plate may be reduced. Therefore, the cover plate may have a desired packaging performance under a curved condition.

Further, according to the disclosed embodiment, the radial stress and the tangential stress of the cover plate may be reduced when the cover plate is bent to match the curved substrate and the curved OLED light-emitting apparatus during a packaging process. The resilient force of the cover plate may be reduced. Therefore, the cover plate may be able to cause the substrate and OLED light-emitting apparatus to have a bending tendency. At the same time, the cover plate may have an enough thickness and a desired strength. Therefore, the cover plate may have a desired packaging effect for the curved display apparatus; and the force applied on the curved display apparatus by the cover plate may be reduced. Therefore, the cover plate may have a desired packaging performance under a curved condition.

Other aspects of the present disclosure can be understood by those skilled in the art in light of the description, the claims, and the drawings of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

According to the disclosed embodiments, a cover plate is provided. The cover plate may include a plate body. A plurality of auxiliary bending structures may be disposed on the plate body. The auxiliary bending structures may assist the cover plate to bend so as to cause the cover plate to be able to package a curved display apparatus.

The disposing of the auxiliary bending structures may be able to cause the cover plate to have a bending tendency. Thus, the packaging stress of the cover plate under a curved condition may be reduced. Therefore, the cover plate may be able to package a curved display apparatus; and cause the curved display apparatus to show a certain degree of curving. Further, by using such a cover plate, the cover plate may have a desired packaging effect for the curved display apparatus; and the force applied on the curved display apparatus by the cover plate may be reduced. Therefore, the cover plate may have a desired packaging performance under a curved condition.

In one embodiment, the auxiliary bending structures may be a plurality of grooves. The grooves may reduce the radial stress and tangential stress applied on the curved display apparatus by the cover plate during a packaging process. Thus, the resilience force of the cover plate during the packaging process may be reduced; and it may be easier for the cover plate to package a curved display apparatus.

Further, according to the disclosed embodiments, an OLED display panel is provided. The OLED display panel may include the disclosed cover plate.

Figure 1:
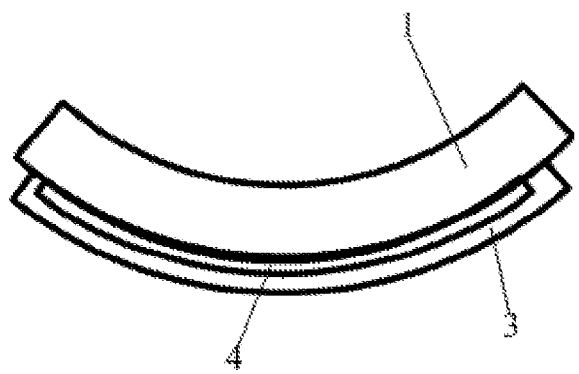
FIG. 1 illustrates an existing OLED display panel.
Figure 2:
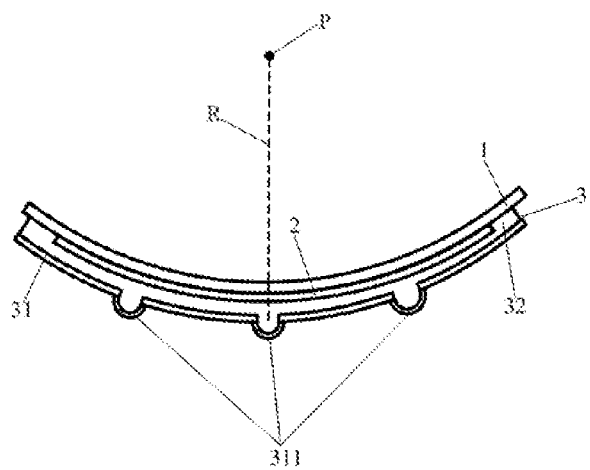
FIG. 2 illustrates an exemplary curved OLED display panel with an exemplary curved cover plate according to the disclosed embodiments.

FIG. 2 illustrates an exemplary OLED display panel according to the disclosed embodiments. As shown in FIG. 2, the OLED display may include a substrate 1 and an OLED light-emitting apparatus 2 disposed on the substrate 1. The substrate 1 and the OLED light-emitting apparatus 2 may be curved with an arc shape.

Figure 2A:
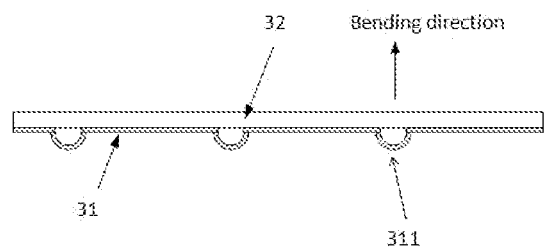
FIG. 2A illustrates the cover plate illustrated in FIG. 2 without bending.

Further, the OLED display may also include a packaging structure 3 for packaging the OLED light-emitting apparatus 2. As shown in FIG. 2 and FIG. 2A, the packaging structure 3 may include a disclosed cover plate 31 and a barrier layer 32 between the packaging structure 3 and the OLED light-emitting apparatus 2. The cover plate 31 may include a plate body (not labeled) and a plurality of auxiliary bending structures 311 disposed on the plate body. The auxiliary bending structure 311 may be configured to assist to bend the cover plate 31 to an arc shape. The arc shape of the curved cover plate 31 may match the arc shape of the curved substrate 1 and the curved OLED light-emitting apparatus 2.

Having the auxiliary bending structures 311 on the cover plate 31 may be able to cause the cover plate 31 to have a bending tendency. Thus, the radial stress and the tangential stress of the curved cover plate 31 may be reduced when the cover plate 31 is bent to have the arc shape to match the arc shape of the substrate 1 and the OLED light-emitting apparatus 2. Correspondingly, the resilience force of the cover plate 31 under the curved condition may be reduced. Thus, the cover plate 31 may be able to not only cause the OLED display panel to have a certain degree of curving, but also the cover plate 31 may have designed thickness and strength. Therefore, the cover plate 31 may have a desired packaging quality to the curved OLED light-emitting apparatus 2; the packaging force on the curved OLED light-emitting apparatus 2 applied by the curved cover plate 31 may be reduced; and the cover plate 31 may have a desired packaging performance under the curved condition.

In one embodiment, the auxiliary bending structures 311 are the grooves 311 disposed on the cover plate 31. The direction of the openings of the grooves 311 may be identical to the bending direction of the cover plate 31. Referring to FIG. 2, the bending direction of the cover plate 31 may refer to the side of the arc radius "R" of the curved cover plate 31. The grooves 311 having such openings may cause the cover plate 31 to have a certain degree of bending tendency; and may significantly reduce the radial stress and the tangential stress along the arc surface of the curved cover plate 31. Thus, the resilience force of the cover plate 31 under the arc-shaped condition may be significantly reduced; and the cover plate 31 may be easier to be bent without changing its thickness.

The arc surface of the curved cover plate 31 may be a portion of the arc surface of a cylindrical surface with an axis "P". The direction of the axis "P" is along a direction perpendicular to the paper.

Figure 3:
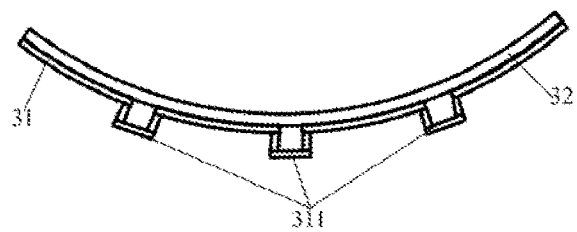
FIG. 3 illustrates another exemplary curved cover plate according to the disclosed embodiments.
Figure 3A:
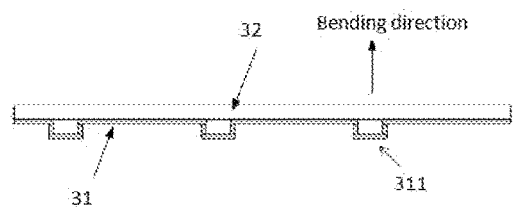
FIG. 3A illustrates the cover plate illustrated in FIG. 3 without bending.
Figure 4:
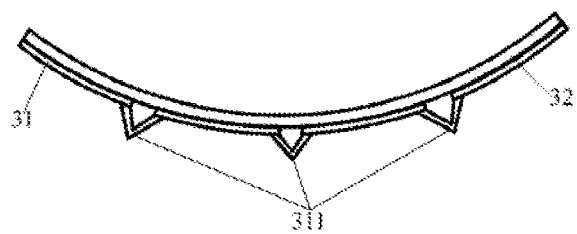
FIG. 4 illustrates another exemplary curved cover plate according to the disclosed embodiments.
Figure 4A:
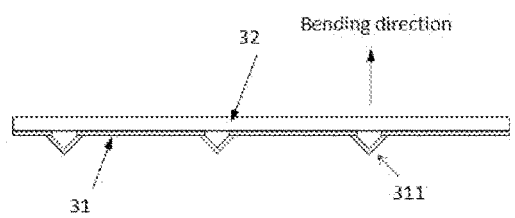
FIG. 4A illustrates the cover plate illustrated in FIG. 4 without bending.

In one embodiment, as shown in FIG. 2 and FIG. 2A, the cross-sectional view of the grooves 311 perpendicular to the axis "P" is a semi-circle. In certain other embodiments, as shown in FIG. 3 and FIG. 3A, a cross-sectional view of the grooves 311 perpendicular to the axis "P" is a rectangle, and the surface of the grooves 311 may be a partial rectangular prism. In still certain other embodiments, as shown in FIG. 4 and FIG. 4A, the cross-sectional view of the grooves perpendicular to the axis "P" is a triangle, and the surface of the grooves 311 may be a partial triangular prism. As long as the plurality of grooves 311 are able to assist the cover plate 31 to bend to a curved shape to match the designed curve shape of the substrate 1 and the OLED light-emitting apparatus 2, the cross-section of the grooves 311 may be any appropriate shape.

In one embodiment, the width of the grooves may approximately 3 times~1000 times of the thickness of the cover plate 31. The width of a groove refers to the size of groove on the surface of the cover plate. The depth of the grooves may be 3 times~1000 times of the thickness of the cover plate 31. The depth of the grooves refers the distance between the surface of the cove plate 31 and the lowest point of the groove along the thickness direction of the cover plate 31. The thickness of the cover plate 31 may be designed with any appropriate value as long as the cover plate 31 has an enough strength and is able to prevent the external water and oxygen from entering into the OLED light-emitting apparatus 2. The combination of the width of the openings and the depth of the grooves may be able to cause the cover plate 31 have the corresponding thickness to have a certain degree of bending tendency. Thus, the radial stress and the tangential stress of the curved cover plate 31 may be reduced. Therefore, the cover plate 31 may have a desired packaging thickness and packaging stress. At the same time, the cover plate 31 may have a desired flexibility. Thus, the cover plate 31 may be able to better package the curved OLED light-emitting apparatus 2.

The cover plate 31 with the grooves 311 may be made of any appropriate material, such as metal foil, polymer, or glass, etc. The cover plate 31 and the grooves 311 made of such material may be able to not only have a desired packaging effect to the OLED light-emitting apparatus 2, but also prevent the external water and oxygen from entering into OLED display panel to damage the OLED light-emitting apparatus 2.

The barrier layer 32 may be made of any appropriate material, such as polymer material, etc. The polymer material may fill in the grooves 311. The barrier layer 32 made of polymer material may be able to have an insolation effect to the external oxygen and water. Thus, it may prevent the external oxygen and water from damaging the OLED light-emitting apparatus 2.

In one embodiment, an inert gas layer or a vacuum layer (not labeled) may be disposed between the cover plate 31 and the barrier layer 32. That is, inert gas may be filled in the grooves 311, or the grooves 311 may be at a vacuum condition. The disposition of the inert gas layer or the vacuum layer between the cover plate 31 and the barrier layer 32 may aid the formation of the barrier layer 32 on the cover plate 31; and it may promote the adhesion between the cover plate 31 and the substrate 1. Thus, it may aid the cover plate 31 to better package the OLED light-emitting apparatus 2.

Figure 5:
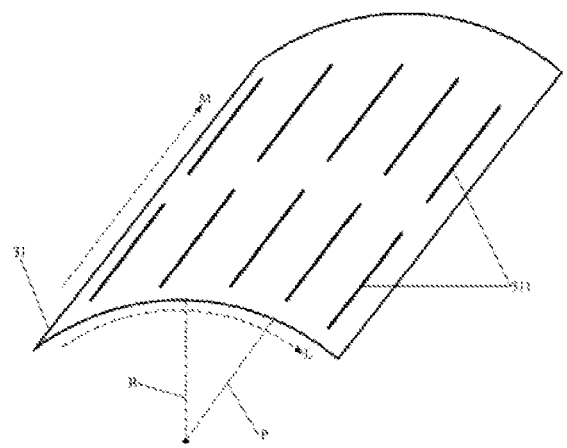
FIG. 5 illustrates an exemplary groove distribution on a curved cover plate according to the disclosed embodiments.
Figure 5A:
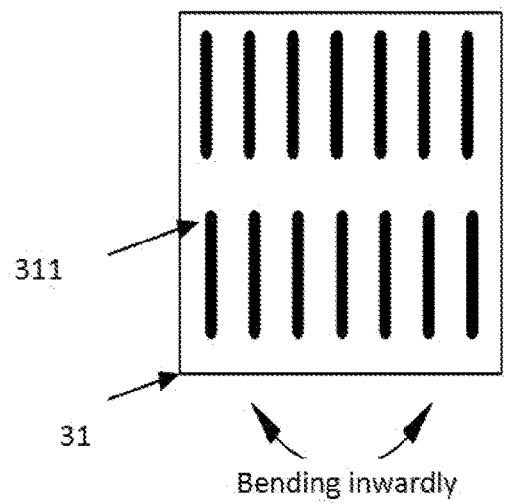
FIG. 5A illustrates the exemplary groove distribution illustrated in FIG. 5 without bending.

FIG. 5 and FIG. 5A illustrate an exemplary distribution of the grooves 311 on the cover plate 31 of the OLED display panel illustrated in FIG. 2. As shown in FIG. 5, the plurality of the grooves 311 may be distributed as an array, i.e., comprising rows and columns with pre-determined intervals on the cover plate 31. The cross-section of the cover plate 31 perpendicular to the axis "P" is an arc. The plurality of the grooves 311 may be distributed along an extension direction "L" of the arc and the longitudinal direction "M" of the grooves 311. That is, more than one groove 311 may be in one row; and more than one groove 311 may be in one column. In one embodiment, the lengths of the plurality of the grooves 311 may be identical; the intervals between adjacent grooves 311 along the extension direction "L" may be identical; and the intervals between adjacent grooves 311 along the longitudinal direction "M" of the grooves 311 may be identical. In certain other embodiments, the lengths of the grooves 311 may be different; and the intervals may be different.

The longitudinal direction "M" of the grooves 311 may be parallel with the axis "P" of the cylindrical surface. Such a configuration may significantly reduce the radial stress and the tangential stress of the cover plate along its arc surface. It may not only increase the strength of the curved cover plate 31, but also increase the flexibility of the curved cover plate 31. Thus, the cover plate 31 may be able to better package the curved OLED light-emitting apparatus 2.

Further, the ends of the grooves 311 may not reach the edges of the cover plate 31 perpendicular to the longitudinal direction "M" of the grooves 311. Such a configuration may cause the cover plate 31 to better attach with substrate 1 at the edges of the cover plate 31. At the same time, the edges of the cover plate 31 may not be broken because of the disposition of the grooves 311. Thus, the cover plate 311 may better package and protect the OLED light-emitting apparatus 2.

Figure 6:
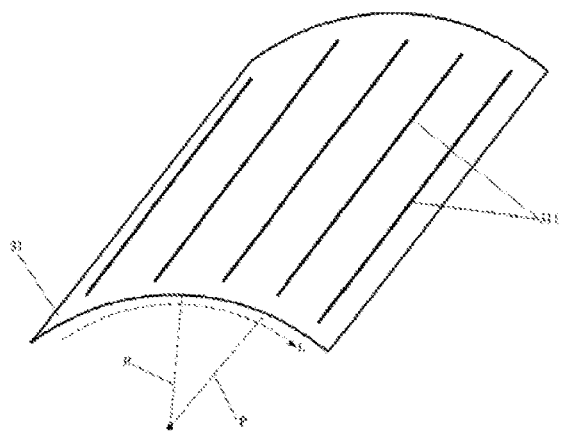
FIG. 6 illustrates another exemplary groove distribution on a curved cover plate according to the disclosed embodiments.
Figure 6A:
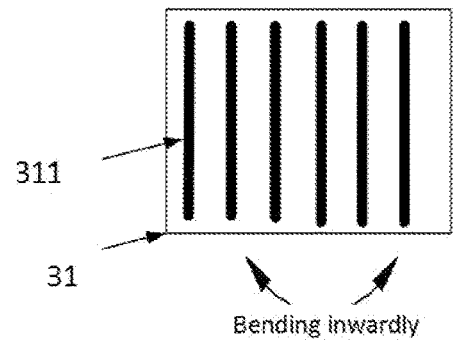
FIG. 6A illustrates the exemplary groove distribution illustrated in FIG. 6 without bending.

FIG. 6 and FIG. 6A illustrate another exemplary distribution of the grooves 311 on the cover plate 3 according to the disclosed embodiments. As shown in FIG. 6 and FIG. 6A, the plurality of grooves 311 may be distributed on the cover plate 311 as a single column along the extension direction "L" of the arc. The intervals between adjacent grooves 311 may be identical. The lengths of the grooves 311 may be identical. Further, the ends of the grooves 311 may not level with the edges of the cover plate 31 along the extension direction "L". That is, the length of the grooves 311 may be smaller than the length of the edges of the cover plate parallel with the longitudinal direction "M" of the grooves 311.

Such a distribution of grooves 311 may cause the radial stress and tangential stress at different positons of the cover plate 31 to be all correspondingly reduced. Thus, the different positions of the cover plate 31 may all have a certain degree of bending tendency. Therefore, the radial stress and the tangential stress of the entire cover plate 31 may be reduced; and the entire cover plate 31 may have a bending tendency.

In certain other embodiments, the plurality of grooves 311 may be randomly distributed along the extension direction "L". In still certain other embodiments, the plurality of grooves 311 may be randomly distributed, or distributed with a same pre-determined interval along the longitudinal direction "M".

Thus, anther OLED display panel is provided by the disclosed embodiments. The OLED display panel comprises the cover plate 31 illustrated in FIG. 6 and FIG. 6A.

Figure 7:
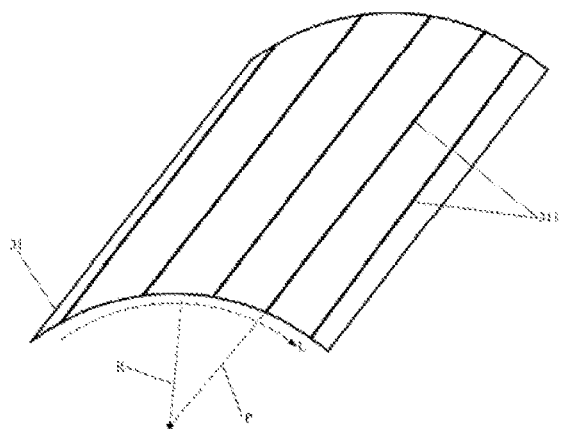
FIG. 7 illustrates another exemplary groove distribution on a curved cover plate according to the disclosed embodiments.
Figure 7A:
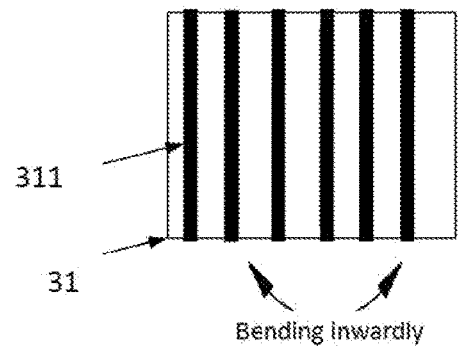
FIG. 7A illustrates the exemplary groove distribution illustrated in FIG. 7 without bending.

FIG. 7 and FIG. 7A illustrate another exemplary distribution of the plurality of grooves 311 on the cover plate 31 according to the disclosed embodiments. As shown in FIG. 7 and FIG. 7A, the plurality of grooves 311 may be distributed on the cover plate 311 along the extension direction "L" of the arc. The intervals between adjacent grooves 311 may be identical; and the lengths of the grooves may be identical. Further, comparing with the cover plate illustrated in FIG. 6, the ends of the grooves 311 may level with the edges of the cover plate 31 parallel with the extension direction "L".

Such a distribution of grooves 311 may also be able to cause the radial stress and tangential stress at different positons of the cover plate 31 to all be correspondingly reduced. Thus, the different positions of the cover plate 31 may all have certain degrees of bending tendency. Therefore, the radial stress and the tangential stress of the entire cover plate 31 may be reduced; and the entire cover plate 31 may have a bending tendency.

In certain other embodiments, the plurality of grooves 311 may be randomly distributed along the extension direction "L". The ends of the grooves 311 may level with the edges of the cover plate parallel with the extension direction "L". In still certain other embodiments, the plurality of grooves 311 may be randomly distributed, or distributed with a same pre-determined interval along the longitudinal direction "M". The ends of the grooves 311 may level with the edges of the cover plate 31 parallel with the longitudinal direction "M".

Thus, another OLED display panel may be provided. The OLED display panel comprises the cover plate 31 illustrated in FIG. 7 and FIG. 7A.

Figure 8:
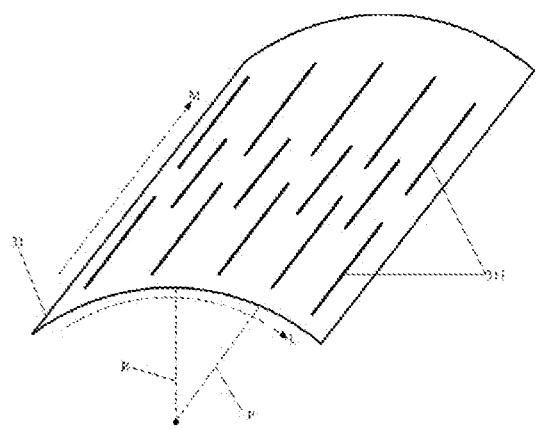
FIG. 8 illustrates another exemplary groove distribution on a cover plate according to the disclosed embodiments.
Figure 8A:
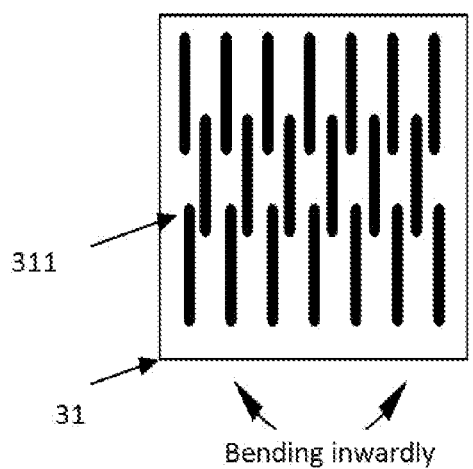
FIG. 8A illustrates the exemplary groove distribution illustrated in FIG. 8 without bending.
Figure 9:
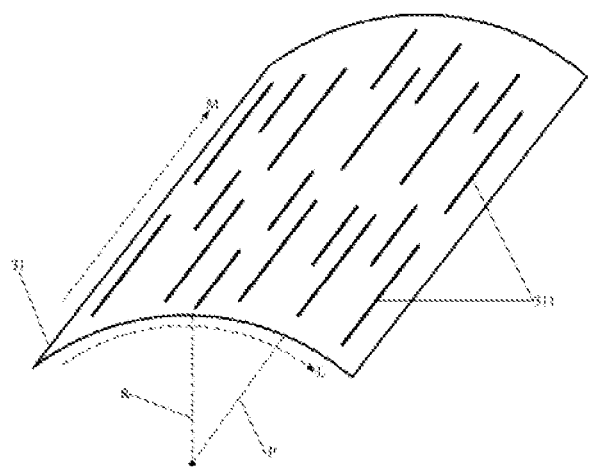
FIG. 9 illustrates another exemplary groove distribution on a cover plate according to the disclosed embodiments.
Figure 9A:
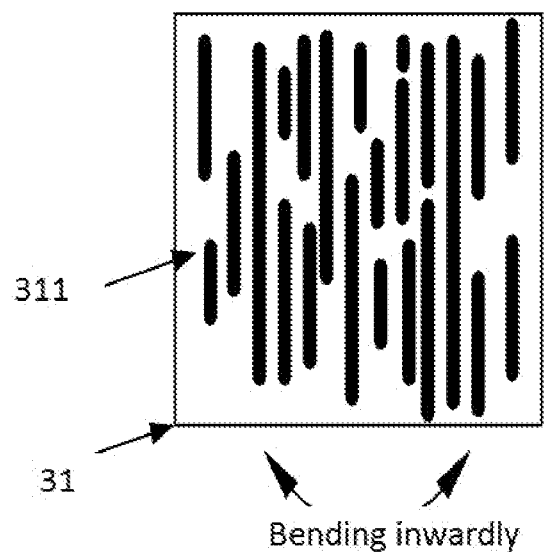
FIG. 9A illustrates the exemplary groove distribution illustrated in FIG. 9 without bending.

FIG. 8 and FIG. 8A illustrates an exemplary distribution of the plurality of grooves 311 on the curved cover plate 31. As shown in FIG. 9 and FIG. 9A, the plurality of the grooves 311 may be distributed as an array, i.e., comprising rows and columns with pre-determined intervals. The cross-section of the cover plate 31 perpendicular to the axis "P" is an arc. The plurality of the grooves 311 may be distributed along the extension direction "L" of the arc and the longitudinal direction "M" of the grooves 311. That is, more than one groove 311 may be in one row; and more than one groove 311 may be in one column. Further, two adjacent columns may have an overlap; and the grooves 311 in one column may be disposed in the middle of two adjacent rows in another column. The lengths of the plurality of the grooves 311 may be identical; and the intervals between adjacent grooves 311 along the extension direction "L" may be identical.

Such a configuration may also be able to significantly reduce the radial stress and the tangential stress of the cover plate 31 along its arc surface. It may not only increase the strength of the curved cover plate 31, but also increase the flexibility of the curved cover plate 31. Thus, the cover plate 31 may be able to better package the curved OLED light-emitting apparatus 2.

Further, the ends of the grooves 311 may not level with the edges of the cover plate 31 perpendicular to the longitudinal direction of the grooves 311. Such a configuration may cause the cover plate 31 to better attach with substrate 1 at the edge of the cover plate 31. At the same time, the edges of the cover plate 31 may not be broken because of the disposition of the grooves 311. Thus, the cover plate 311 may better package and protect the OLED light-emitting apparatus 2.

Thus, another OLED display panel may be provided. The OLED display panel comprises the cover plate 31 illustrated in FIG. 8 and FIG. 8A.

FIG. 9 and FIG. 9A illustrate another exemplary distribution of the plurality of grooves 311 on the cover plate 31 according to the disclosed embodiments. As shown in FIG. 8 and FIG. 8A, the plurality of grooves 311 may be randomly distributed on the cover plate 31 along the extension direction "L" of the arc. The intervals between adjacent grooves 311 may be identical or different; and the lengths of the grooves may be different. Further, the ends of the grooves 311 may not level with the edges of the cover plate 31 parallel with the extension direction "L". In certain other embodiments, adjacent rows of the grooves have an overlap.

Such a distribution of grooves 311 may also be able to cause the radial stress and tangential stress at different positons of the cover plate to all be correspondingly reduced. Thus, the different positions of the cover plate 31 may also have certain degrees of bending tendency, respectively. Therefore, the radial stress and the tangential stress of the entire cover plate 31 may be reduced; and the entire cover plate 31 may have a bending tendency.

Thus, another OLED display panel may be provided. The OLED display panel comprises the cover plate 31 illustrated in FIG. 9 and FIG. 9A.

Figure 10:
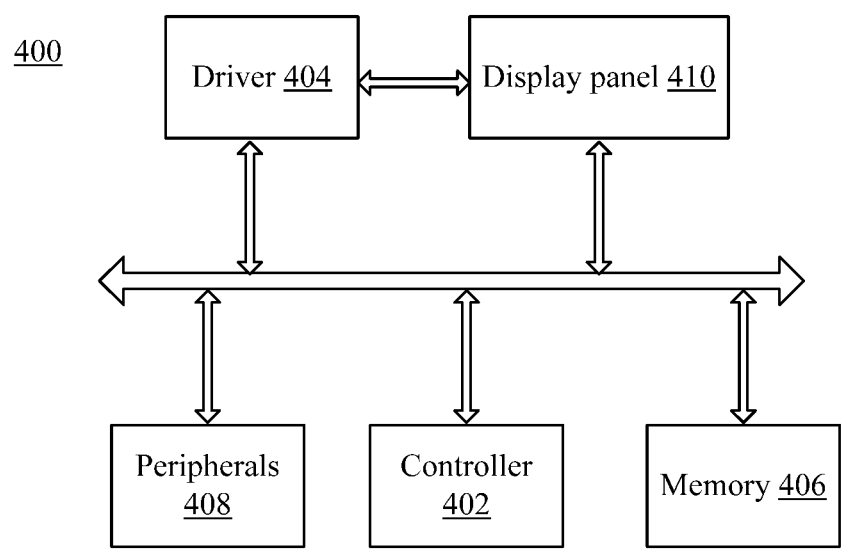
FIG. 10 illustrates a block diagram of an exemplary curved display apparatus according to the disclosed embodiments.

Further, according to the disclosed embodiment, a curved display apparatus is provided. FIG. 10 illustrates a block diagram of an exemplary curved display apparatus 400 incorporating at least a disclosed OLED display panel and other aspects of the present disclosure. The curved display apparatus 400 may be any appropriate apparatus or component with certain display function, such as an OLED panel, an OLED TV, an OLED monitor, an OLED cell phone or an OLED navigation system, LCD, e-paper, etc. As shown in FIG. 10, the display apparatus 400 includes a controller 402, a driver circuit 404, a memory 406, peripherals 408, and a curved display panel 410. Certain apparatus may be omitted and other apparatus may be included.

The controller 402 may include any appropriate processor or processors. Further, the controller 402 can include multiple cores for multi-thread or parallel processing. The memory 406 may include any appropriate memory modules. The memory 406 may store computer programs for implementing various processes, when executed by the controller 402.

Peripherals 408 may include any interface apparatus for providing various signal interfaces. Further, peripherals 408 may include any input and output (I/O) apparatus. Peripherals 408 may also include any appropriate communication module for establishing connections through wired or wireless communication networks.

The driver circuitry 404 may include any appropriate driving circuits to drive the curved display panel 410. The curved display panel 410 may comprise at least a disclosed curved display panel. During operation, the curved display panel 410 may be provided with image signals by the controller 402 and the driver circuit 404 for display. Because the disclosed OLED display panel may have an improved packaging performance, the packaging quality and the packing performance of the display apparatus may also be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A cover plate for packing a curved display apparatus, comprising:
a plate body having a plurality of grooves configured to assist to bend the plate body to cause the cover plate to have a bending tendency for reducing a radial stress and tangential stress of the curved display apparatus, wherein a longitudinal axis of one of the plurality of grooves is approximately perpendicular to a bending direction of the cover plate.

2. The cover plate according to claim 1, wherein: an open direction of the grooves is identical to the bending direction of the cover plate.

3. The cover plate according to claim 2, wherein:
the cover plate having the bending tendency comprises an arc surface;
the arc surface of the cover plate is a portion of a cylindrical surface;
a longitudinal direction of the grooves is parallel to an axis of the cylindrical surface; and
a cross-section view of the cover plate perpendicular to the axis of the cylindrical surface is an arc.

4. The cover plate according to claim 3, wherein: a length of the groove is no less than a length of edges of the cover plate parallel to the longitudinal direction of the grooves.

5. The cover plate according to claim 4, wherein: ends of the grooves are configured to intersect edges of the cover plate perpendicular to the longitudinal direction of the grooves.

6. The cover plate according to claim 3, wherein:
the plurality of grooves are distributed on the cover plate as an array having a plurality of rows and a plurality of columns along an extension direction of the arc; and
lengths of the grooves are identical.

7. The cover plate according to claim 3, wherein:
the plurality of grooves are distributed on the cover plate as a single column along the extension direction of the arc; and
lengths of the grooves are identical.

8. The cover plate according to claim 3, wherein:
the plurality of the grooves are randomly distributed on the cover plate along the extension direction of the arc; and
lengths of the grooves are different.

9. The cover plate according to claim 6, wherein: adjacent rows of the grooves have an overlap.

10. The cover plate according to claim 1, wherein: the cover plate and the grooves are both made of one of metal foil, polymer or glass.

11. The cover plate according to claim 1, wherein: a cross-sectional view of one of the grooves is one of a semi-circle, semi-ellipse, triangle, or rectangle.

12. The cover plate according to claim 1, wherein:
a width of the grooves is approximately 3 times~1000 times of a thickness of the cover plate; and
a depth of the grooves is approximately 3 times~1000 times of the thickness of the cover plate.

13. A curved display apparatus, comprising:
a packaging structure for packaging the curved display apparatus,
wherein the packaging structure comprises a cover plate having a plurality of grooves to cause the cover plate to have a bending tendency for reducing a radial and tangential stress of the curved display apparatus, wherein a longitudinal axis of one of the plurality of grooves is approximately perpendicular to a bending direction of the cover plate.

14. The curved display apparatus according to claim 13, wherein: an open direction of the grooves is identical to the bending direction of the cover plate.

15. The curved display apparatus according to claim 14, wherein:
the cover plate having the bending tendency comprises an arc surface,
the arc surface of the cover plate is a portion of a cylindrical surface;
a longitudinal direction of the grooves is parallel to an axis of the cylindrical surface; and
a cross-section view of the cover plate perpendicular to the axis of the cylindrical surface is an arc.

16. The curved display apparatus according to claim 14, wherein: a length of the groove is no less than a length of edges of the cover plate parallel to the longitudinal direction of the grooves.

17. The curved display apparatus according to claim 14, wherein:
the plurality of grooves are distributed on the cover plate as an array having a plurality of rows and a plurality of columns along an extension direction of the arc; and
lengths of the grooves are identical.

18. The curved display apparatus according to claim 14, wherein:
the plurality of grooves are distributed on the cover plate as a single column along the extension direction of the arc; and
lengths of the grooves are identical.

19. The curved display apparatus according to claim 13, wherein: the cover plate and the grooves are both made of one of metal foil, polymer or glass.

20. The curved display apparatus according to claim 13, wherein:
the grooves are configured to fill with one of a polymer material, an inert gas or a vacuum.

* * * * *